United States Patent [19]
Graf et al.

[11] Patent Number: 5,379,178
[45] Date of Patent: Jan. 3, 1995

[54] METHOD AND DEVICE FOR TRIGGERING AN ELECTROMAGNETIC CONSUMER

[75] Inventors: Herbert Graf, Dornstetten; Juergen Schwenger, Waiblingen; Werner Zimmermann, Stuttgart; Bernd Wichert, Kernen; Thomas Bielesch, Muehlacker, all of Germany

[73] Assignee: Robert Bosch GmbH, Stuttgart, Germany

[21] Appl. No.: 965,298

[22] PCT Filed: Jul. 12, 1991

[86] PCT No.: PCT/DE91/00572
§ 371 Date: Jan. 29, 1993
§ 102(e) Date: Jan. 29, 1993

[87] PCT Pub. No.: WO92/03646
PCT Pub. Date: Mar. 5, 1992

[30] Foreign Application Priority Data

Aug. 18, 1990 [DE] Germany .............. 4026224
Sep. 20, 1990 [DE] Germany .............. 4029794

[51] Int. Cl.⁶ ............ F02D 5/00; G05F 1/58; H02H 7/122
[52] U.S. Cl. .................. 361/152; 123/490; 361/153; 361/18; 361/41; 361/74; 361/194; 323/908
[58] Field of Search .......... 361/18, 58, 45, 86, 361/41, 74, 153, 152, 154, 155, 156, 160, 170, 187, 194–198; 323/908, 901; 363/50, 55, 56; 123/490

[56] References Cited

U.S. PATENT DOCUMENTS

4,776,314  9/1988  Krauter ............... 123/490
4,949,211  8/1990  Edwards ............... 361/18

Primary Examiner—A. D. Pellinen
Assistant Examiner—Aditya Krishnan
Attorney, Agent, or Firm—Kenyon & Kenyon

[57] ABSTRACT

In the case of a method and a device for triggering an electromagnetic consumer (1), which is connected in series to a switching means (2), the voltage applied to the switching means (2) is fed to a voltage comparison means (12) and compared there to the voltage of a reference voltage source (13). Dependent upon this voltage comparison, an output signal is produced at the output terminal of the voltage comparison means (12), which serves to switch over a suppressor device (4).

16 Claims, 4 Drawing Sheets

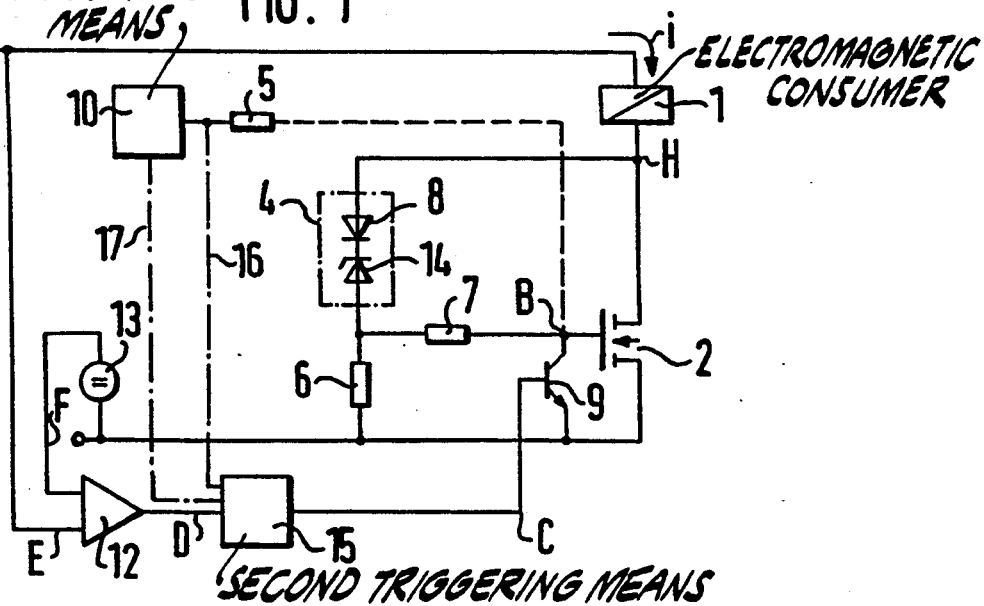
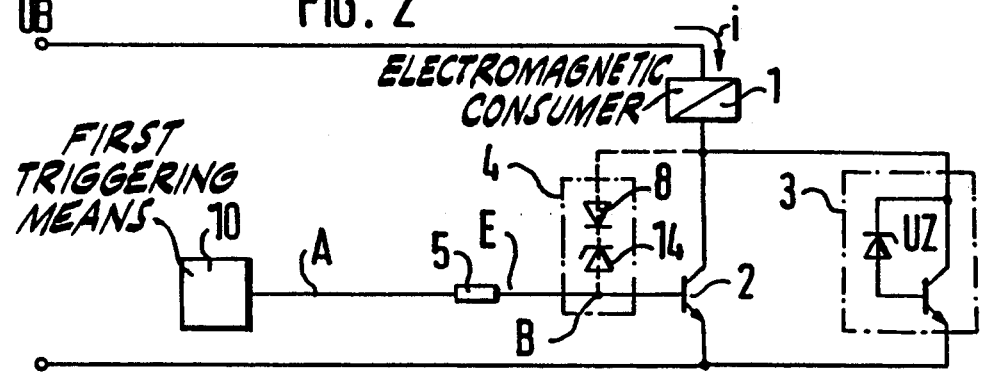
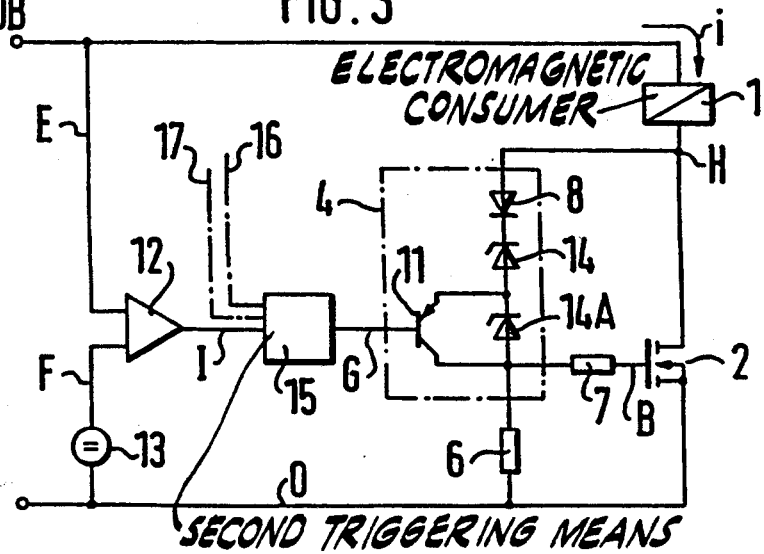

FIG. 8
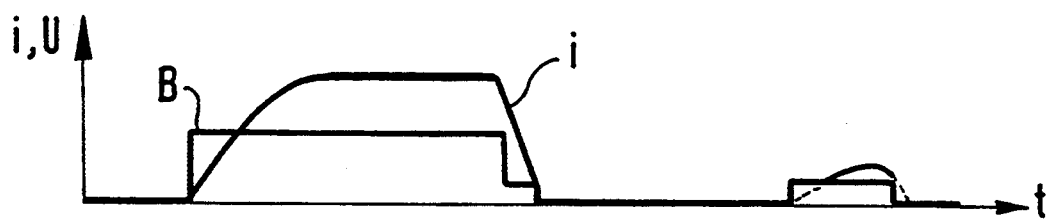
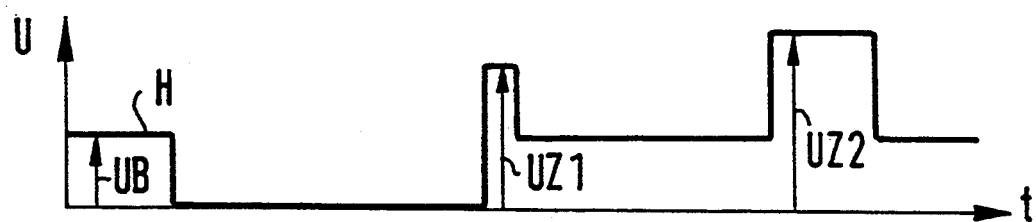
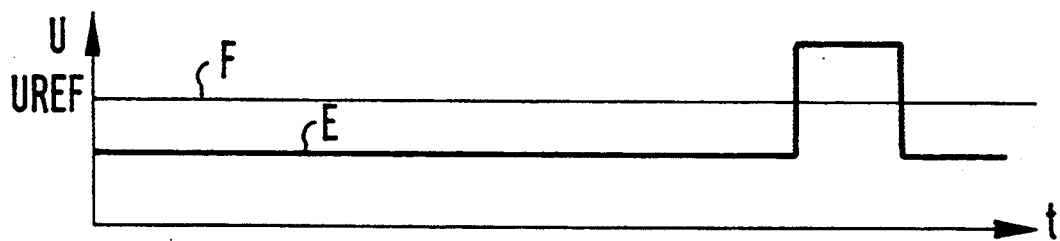

METHOD AND DEVICE FOR TRIGGERING AN ELECTROMAGNETIC CONSUMER

FIELD OF THE INVENTION

The present invention relates to a method and device for triggering an electromagnetic consumer.

BACKGROUND OF THE INVENTION

The German Printed Patent No. 29 05 900 discloses a device for controlling the de-excitation time of electromagnetic devices, in particular electromagnetic injection valves in internal combustion engines, in which a circuit arrangement having an especially controllable output voltage is connected in series or in parallel to the electromagnetic device. In the case of known devices of this type, the inductive consumer is fed, for example, from a voltage source via a series-connected transistor, which is capable of being controlled by triggering means. A desired, fast current suppression when the transistor is switched off can be achieved by means of a Zener diode, which is wired parallel to the transistor, or rather by a transistor which is operated in a comparable manner with a Zener voltage, which is higher than the operating voltage at the moment of switch-off.

Instead of a separate suppressor device, such a transistor can also be directly provided with a so-called Zener bracketing and, thus, also be operated as a suppressor device. A disadvantage of this known device is that the suppressor device then also becomes unintentionally conductive and, in some instances, is unacceptably thermally stressed when the operating voltage in the case of a switched-off transistor becomes greater than the Zener voltage. This can occur, for example, when there is a so-called load-dump pulse on the operating-voltage line.

SUMMARY OF THE INVENTION

The present invention has the advantages that an imminent overloading of the suppressor device is recognized, and that its destruction can be avoided by switching over the suppressor device as a preventive measure. Switching-over in the sense of the present invention means switching off the suppressor device, or also switching over the threshold voltage value that is characteristic of the suppressor device. The present invention begins with the realization that the suppressor device is always in imminent danger of being destroyed as the result of thermal overloading when, in the switched-off state of the switching element, the operating voltage exceeds the switching voltage ("Zener voltage") of the suppressor device. The present invention achieves its goal in that a dangerous rise in voltage across the operating-voltage line is recognized and, from this is derived a switching criterion for switching over the suppressor device.

A particularly advantageous device for triggering an electromagnetic consumer, which has a series-connected electromagnetic consumer and first switching means with first triggering means for actuating the switching means, and has a suppressor device, comprises voltage comparison means and second switching means, as well as second triggering means. In this case, the voltage comparison means compare the operating voltage to a specifiable setpoint value, and the second triggering means activate the second switching means for the purpose of switching over the suppressor device when the operating voltage exceeds a specifiable voltage value.

In a particularly advantageous exemplified embodiment of the device according to the present invention, a comparator is provided as a voltage comparison means, whose input terminals are supplied with the operating voltage and the voltage of a reference voltage source. Transistors are provided as first and second switching means in the above-mentioned device. The triggering means for the first and second switching means preferably comprise at least one microcomputer.

In an advantageous specific embodiment of the device according to the present invention, the suppressor device comprises a series connection consisting of at least one diode and one Zener diode in connection with the first switching means realized as a transistor.

Furthermore, in another advantageous refinement of the device according to the present invention, the suppressor device comprises a series connection consisting of one diode and several Zener diodes, and at least one second switching means, which is connected in parallel to at least one Zener diode. Through this means and in case of need, characteristic threshold voltage values of the suppressor device can be switched over, step-by-step, by carrying out a switching operation of the switching means, which are connected in parallel to the Zener diodes.

DRAWINGS

FIG. 1 shows a circuit diagram of a first exemplified embodiment of the present invention with a switchable suppressor device;

FIG. 2 shows a representation, in principle, of a generally known device including various possibilities for realizing suppressor devices;

FIG. 3 illustrates another exemplified embodiment of the present invention with a suppressor device, in the case of which a characteristic threshold voltage value is able to be switched in at least one step;

Figure 6:
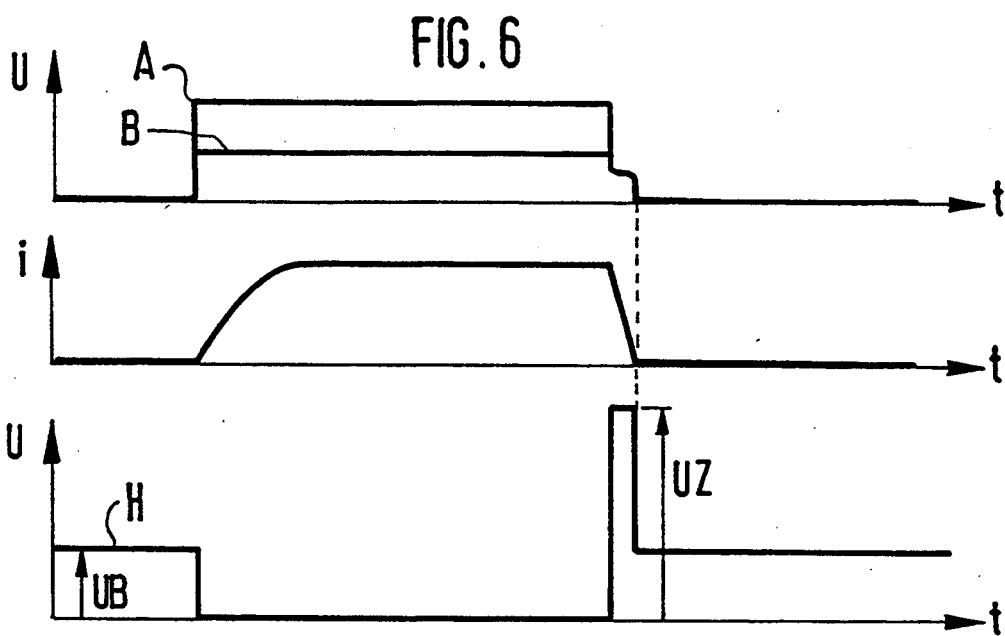
Figure 7:
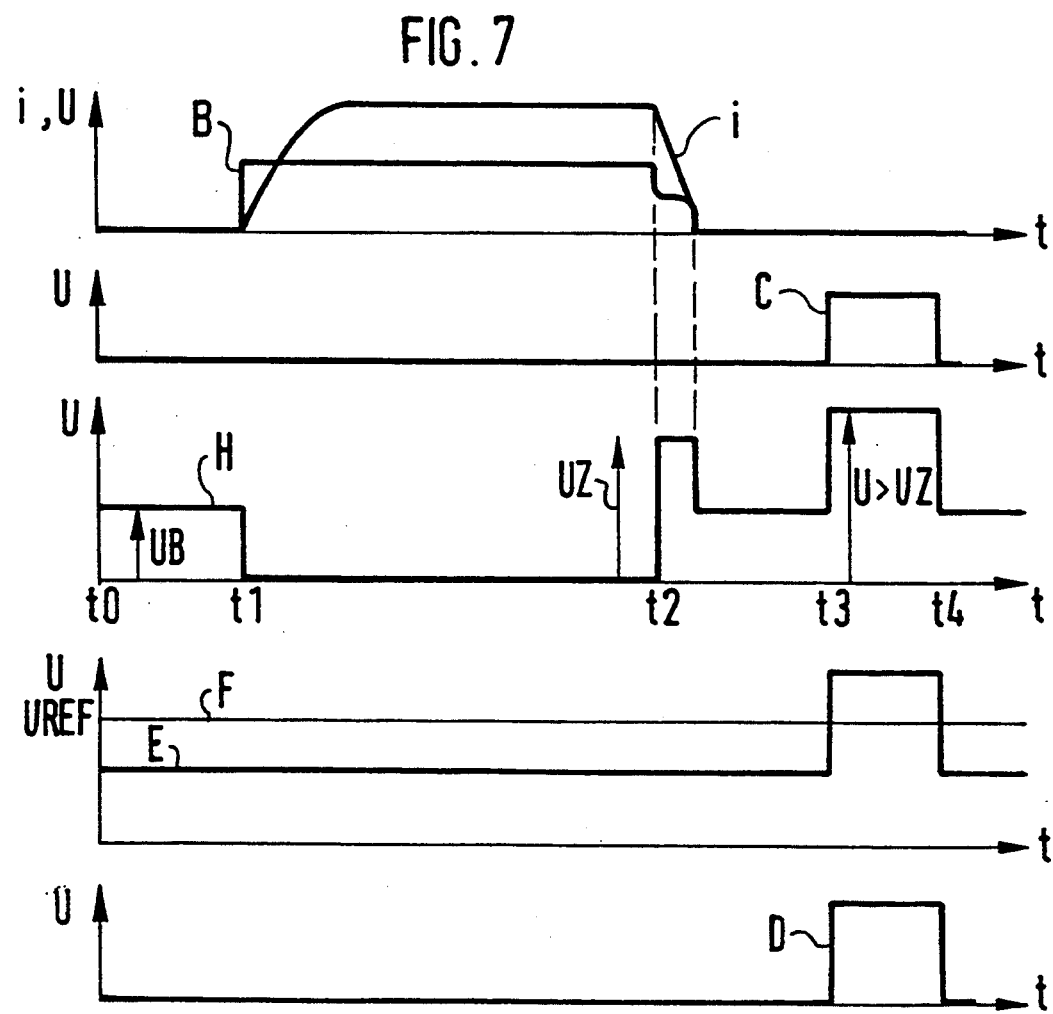

FIG. 6, FIG. 7, and FIG. 8 illustrate pulse diagrams of signal patterns at characteristic points of the above-mentioned exemplified embodiments.

DETAILED DESCRIPTION

FIG. 2 shows a generally known device for triggering an electromagnetic consumer, which comprises an electromagnetic consumer 1, in particular an electromagnetic injection valve for an internal combustion engine and, connected in series to it, a switching means 2, in particular a transistor. The connecting terminal of the electromagnetic consumer 1, which faces away from the switching means 2, is connected to the operating voltage UB. A suppressor device 3, which comprises a transistor and a Zener diode, is connected in parallel to the switching means 2. A suppressor device 4 comprising a series connection of a diode 8 and a Zener diode 14 is alternatively provided. The suppressor device 4 is connected between the base terminal and the collector terminal of the transistor 2. The control terminal (base terminal) of the transistor 2 is connected via a series resistor 5 to a triggering means 10. When the transistor 2 is switched off, a fast current suppression is effected by means of the previously described suppressor devices 3, or rather alternatively 4, to achieve the most precise possible triggering times for the electromagnetic consumer 1. A disadvantage of this known device according to FIG. 2 is that the suppressor devices then also conduct unintentionally and, consequently, in certain instances are unacceptably thermally stressed when, given a switched-off transistor 2, the operating voltage UB becomes greater than the characteristic threshold voltage (Zener voltage) of the suppressor device 3, 4. This can be caused, for example, by a so-called load-dump pulse on the operating-voltage line.

FIG. 1 shows the circuit diagram of a first exemplified embodiment of the present invention. It comprises an electromagnetic consumer 1, which is connected in series to a first circuit element 2. The connecting terminal of the electromagnetic consumer 1, which faces away from the circuit element 2, is connected to the operating voltage UB. A control terminal of the first switching means 2 is connected via the series connection of the resistor 6, 7 to the grounded connection. A suppressor device 4, which comprises a series connection of a diode 8 and a Zener diode 14, is connected between the interconnection point of the two abovementioned resistors 6, 7 and the interconnection point between the electromagnetic resistor 1 and the first switching means 2. Connected between the control terminal of the first switching means 2 and the grounded connection is the contact-break distance of a second switching means 9, whose control terminal is connected to the output terminal of second triggering means 15. The input terminal of the second triggering means 15 is connected to the output terminal of voltage comparison means 12 having two input terminals.

In some instances, the output signal 16 from the first triggering means 10 or another signal 17 generated by the first triggering means 10 is also fed to the second triggering means 15. This is indicated by a dot-dash line in FIG. 1.

The first input terminal of the voltage comparison means 12 is connected to the operating voltage UB; the second input terminal is connected to the first terminal of a reference voltage source 13, whose second terminal is connected to ground. Also drawn in are first triggering means 10, whose output terminals are connected via a resistor 5 to the control terminal of the first switching means 2.

The exemplified embodiment according to FIG. 3 differs from the previously described exemplified embodiment in essence in that the suppressor device 4 comprises a series connection of a diode 8 and several Zener diodes 14, 14A, whereby at least one of the Zener diodes 14, 14A is connected in parallel to the contact-break distance of second switching means 11.

Figure 4:
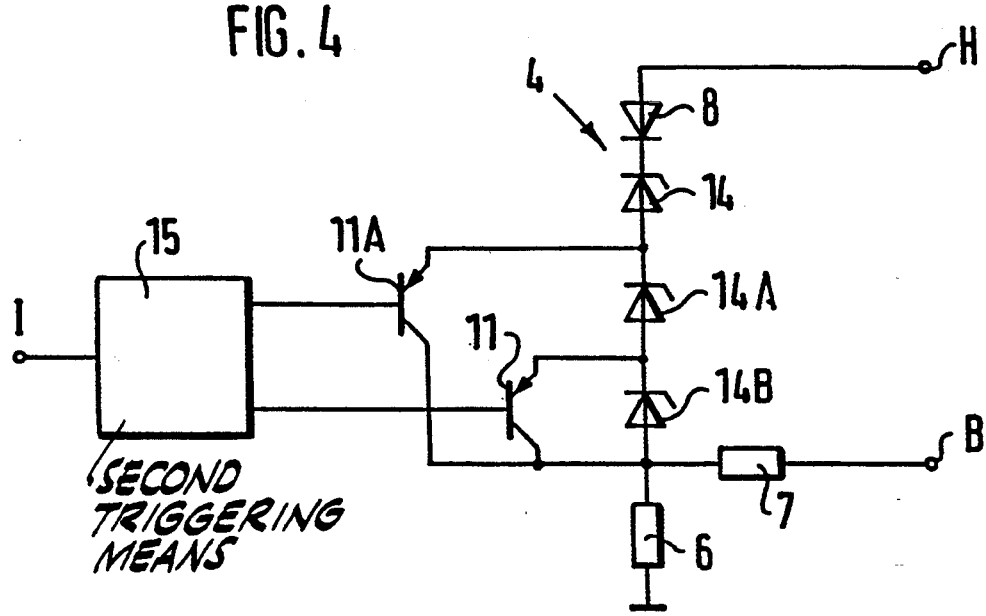
FIG. 4 shows another exemplified embodiment of the present invention with a suppressor device, in the case of which a characteristic threshold voltage value of the suppressor device is able to be switched in several steps.

In the further exemplified embodiment of the present invention according to FIG. 4, which shows a circuit diagram only in part, a series connection of a diode 8 and several Zener diodes 14, 14A, 14B is provided in turn in the suppressor device 4, whereby in this case contact-break distances of second switching means 11, 11A are connected in parallel to several Zener diodes 14A, 14B.

Figure 5:
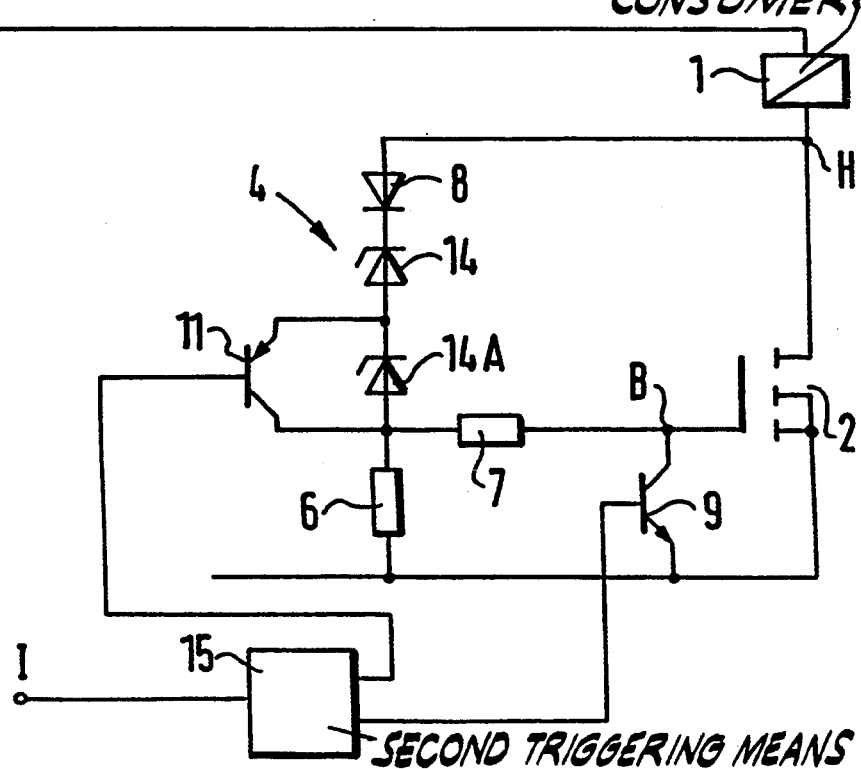
FIG. 5 depicts another exemplified embodiment of the present invention with a suppressor device which is capable of being switched over and switched off.

In the further exemplified embodiment according to FIG. 5, which is also a circuit diagram shown only in part, the suppressor device again comprises a series connection of one diode 8 and several Zener diodes 14, 14A, whereby the contact-break distance of a second switching means 11 is connected in parallel to one Zener diode 14A. In addition, switching means 9 are provided, which enable the control electrode of the first switching means 2 to be connected to ground. The mode of operation of the previously clarified exemplified embodiments will be described in the following.

The diagram in FIG. 6 shows the voltage characteristics for the generally known device according to FIG. 2 at the circuit points A, B, H and the current i flowing through the electromagnetic consumer 1, in each case as a function of the time t. The voltage characteristic at the circuit point H shows that after the electromagnetic consumer 1 is switched off by the switching means 2, the voltage is essentially limited to the voltage value UZ by the suppressor device 3, or rather 4, until the load current i has dropped down to zero. The voltage subsequently drops to the value of the supply voltage UB. However, if very high voltage peaks occur on the operating-voltage line, which considerably exceed the voltage UZ (Zener voltage), the suppressor device 3, 4 is in imminent danger of a thermal overload, as already mentioned at the outset.

This danger is able to be prevented in the case of the exemplified embodiment of the present invention according to FIG. 1, or at least significantly lessened, as explained in the following, also with respect to the diagrams of FIG. 7. The first curve shape of FIG. 7 shows the control voltage for the control input of the switching means 2 at the circuit point B and the characteristic curve of the current i flowing through the electromagnetic consumer. The second curve shape represents the control voltage for the second switching means 9 in the circuit point C. The third curve shape of FIG. 7 illustrates the voltage U as a function of the time t at the circuit point H. The fourth partial diagram of FIG. 7 depicts the constant voltage UREF of the reference voltage source 13, which is applied to the first input terminal of the voltage comparison means 12, and the voltage at the circuit point E, thus at the second input terminal of the voltage comparison means 12. Finally, the fifth partial diagram of FIG. 7 shows the voltage U at the circuit point D.

In the time interval t3, t4, the voltage characteristic at the circuit point H exhibits values, which considerably exceed the Zener voltage UZ. These high voltage values U are applied to the one input terminal of the voltage comparison means 12 and are compared by said means to the constant reference voltage UREF of the reference voltage source 13. In the mentioned time interval t3, t4, the voltage U exceeds the voltage of the reference voltage source. This results in a control signal for the input of the second triggering means 15 becoming available at the output terminal of the voltage comparison means 12, thus at the circuit point D. These second triggering means 15 act, in turn, upon the control input of the second switching means 9 and shift this second switching means into a conductive state. In this manner, the directly controlled member of the first switching means 2 is short-circuited, the voltage restriction carried out by the suppressor device 3, 4 becomes ineffective, and the voltage across the switching means 2 can also assume values higher than UZ. By linking the signal D from the voltage comparison means 12 within the second triggering means 15 to the output signal 16 or to another signal 17 generated within the first triggering means 10, one can succeed in making the voltage restriction ineffective only in quite specific operating states of the overall arrangement. Thus, the triggering of the second switching means 9 can be prevented, for example, when the first switching means 2 is conductive in any case in the time range t1, t2 and, consequently, an over potential in the supply voltage UB at point H cannot become effective at all.

One can dispense with the separate suppressor transistor when the described device is integrated directly into the triggering of the first switching means 2. The trigger signal from a first triggering means 10 can then be fed directly via a resistor 5, as depicted with a dotted line in FIG. 1, to the control electrode of the switching means 2. Accordingly, as previously described, the suppressor device 3, 4 can be then be made completely ineffective at certain operating states of the device, similarly, for instance, to when an unacceptably high voltage occurs (U>UZ), which represents an endangering of the suppressor device 3, 4.

Alternatively, the exemplified embodiments of the present invention according to FIG. 3, FIG. 4 and FIG. 5 also render possible a controlled switchover of the suppressor device 3, 4, in such a way that, for example, dependent upon a higher voltage determined by the voltage comparison means 12, the suppressor voltage UZ (Zener voltage) is switched over between two, or possibly among several, values. This is also clarified on the basis of the diagram of FIG. 8, in which the first partial diagram depicts the voltage U across the circuit point B of FIG. 3 and the current i flowing through the electromagnetic consumer 1. The second partial diagram of FIG. 8 shows the voltage U across the circuit point H of FIG. 3; the third partial diagram illustrates the voltage U across the circuit point E and the reference voltage UREF of the reference voltage source 13. Finally, the last partial diagram of FIG. 8 depicts the voltage U across the circuit point G of the exemplified embodiment according to FIG. 3. To this end, the suppressor device 4 of the device according to FIG. 3 comprises a series circuit having one diode 8 and two Zener diodes 14, 14A, whereby the second Zener diode 14A is able to be short-circuited by a switching means 11. If this switching means is activated by the triggering means 15 in accordance with an output signal from the voltage comparison means 12 (as well as possibly other signals not shown in FIG. 3), then the voltage across the first switching means 2 is limited to a value that is lower than when this second switching means 11 is in its blocking state.

The exemplified embodiment of the invention according to FIG. 4 differs from the exemplified embodiment according to FIG. 3 essentially only in that the suppressor device 4 comprises a series circuit of a diode 8 and several Zener diodes 14, 14A, 14B, whereby in both cases one of the Zener diodes 14B as well as both Zener diodes 14A, 14B are able to be short-circuited by switching means 11, 11A dependent upon output signals from the second triggering means 15. In this manner, the extinction voltage UZ of the suppressor device 4 is able to be adjusted to a total of three different voltage values.

Finally, in the exemplified embodiment according to FIG. 5, a combination of the switching possibilities is provided for the suppressor device 4, according to the exemplified embodiments of FIG. 1 and FIG. 3, or rather FIG. 1 and FIG. 4. This means, that by means of appropriate trigger signals from the second triggering means 15, a switch-over can follow optionally between different extinction voltages UZ, in that the Zener diode 14A is short-circuited by the switching means 11. On the other hand, the restricting effect of the suppressor device 4 can also be completely disabled by the triggering of the switching means 9.

What is claimed is:

1. A method for triggering an electromagnetic consumer, comprising the steps of:
    applying a supply voltage to the electromagnetic consumer;
    switching the electromagnetic consumer between first and second states with a first switching device having output terminals coupled in series to the electromagnetic consumer;
    applying a second voltage, which is formed across the output terminals of the first switching device, to a suppressor device;
    suppressing the second voltage with the suppressor device;
    comparing the supply voltage to a preselected threshold value; and
    controlling the suppression of the second voltage as a function of the comparison.

2. The method according to claim 1, wherein the first state is an off state and the second state is an on state.

3. The method according to claim 1, wherein the step of controlling suppression includes increasing a suppression voltage if the supply voltage exceeds the preselected threshold value.

4. The method according to claim 1, further comprising the step of actuating the first switching device with a triggering device.

5. The method according to claim 1, wherein the step of controlling suppression includes disabling suppression when the supply voltage exceeds the preselected threshold value and while the first switching device is blocked.

6. A device for triggering an electromagnetic consumer, comprising:
    first switching device having output terminals coupled in series to the electromagnetic consumer for switching the electromagnetic consumer between a first state and a second state;
    suppressor device for receiving and suppressing a voltage formed across the output terminals of the first switching device;
    a comparator for comparing a supply voltage applied to the electromagnetic consumer to a preselected threshold value; and
    a controller for controlling the suppression of the voltage formed across the output terminals of the first switching device as a function of the comparison.

7. The device according to claim 6, wherein the controller includes a second switching device.

8. The device according to claim 6, wherein the first state is an off state.

9. The device according to claim 6, wherein the controller controls the suppression by increasing a suppression voltage if the supply voltage exceeds the preselected threshold value.

10. The device according to claim 6, further comprising a reference voltage source for providing the preselected threshold value.

11. The device according to claim 6, wherein the controller disables suppression when the supply voltage exceeds the preselected threshold value and while the first switching device is blocked.

12. The device according to claim 7, wherein the second switching device is coupled to an input of the first switching device so that when the second switching device is activated, the first switching device is blocked.

13. The device according to claim 7, further comprising first and second actuating devices for actuating the first and second switching devices, respectively.

14. The device according to claim 7, wherein each of the first and second switching devices includes a transistor.

15. The device according to claim 7, wherein the suppressor device includes a diode and a Zener diode coupled in series.

16. The device according to claim 15, wherein the Zener diode and the second switching device are coupled in parallel.

* * * * *